United States Patent [19]
Behn et al.

[11] 4,095,199
[45] June 13, 1978

[54] ELECTRICAL LC RESONANT CIRCUIT

[75] Inventors: Reinhard Behn; Harald Loebl, both of Munich; Karl-Heinz Preissinger, Taufkirchen, all of Germany

[73] Assignee: Siemens Aktiengesellschaft, Berlin & Munich, Germany

[21] Appl. No.: 734,101

[22] Filed: Oct. 20, 1976

[30] Foreign Application Priority Data

Oct. 27, 1975 Germany .................... 2548059

[51] Int. Cl.² .................. H03H 7/10; H01G 5/36; H01G 4/34
[52] U.S. Cl. .................. 333/70 R; 29/25.42; 333/70 S; 333/76; 361/303
[58] Field of Search ............. 333/70 R, 70 S, 76, 333/77, 78, 82 R, 82 A; 334/78, 76; 361/273, 305, 303, 313, 315, 323, 277, 278; 29/25.42

[56] References Cited

U.S. PATENT DOCUMENTS

| 3,229,229 | 1/1966 | Tozzi .................... 334/78 X |
| 3,689,810 | 9/1972 | Walles .................. 361/305 |
| 3,857,074 | 12/1974 | Heywang et al. ......... 361/273 X |
| 3,939,440 | 2/1976 | Berg et al. .............. 333/70 S X |
| 3,947,934 | 4/1976 | Olson .................... 333/70 S X |

FOREIGN PATENT DOCUMENTS

6,709,177  1/1968  Netherlands ............. 336/233

*Primary Examiner*—Alfred E. Smith
*Assistant Examiner*—Marvin Nussbaum
*Attorney, Agent, or Firm*—Hill, Gross, Simpson, Van Santen, Steadman, Chiara & Simpson

[57] ABSTRACT

An electrical LC resonant circuit, particularly useful for channel filters in carrier frequency technology, has a fixed-tuned coil and a capacitor tunable by the removal of layer surface portions. The capacitor is constructed as an essentially flat, self-healing layer capacitor having a relatively small number of layer surfaces and dielectric layers lying one upon the other.

12 Claims, 2 Drawing Figures

ELECTRICAL LC RESONANT CIRCUIT

BACKGROUND OF THE INVENTION

1. Field of the Invention

The present invention relates to LC resonant circuits with narrow tolerance limits for the resonant frequency, and more particularly to such circuits useful as channel filters in carrier frequency technology.

2. Description of the Prior Art

Resonant circuits of this type are customarily adjusted to the desired resonant frequency by means of tuning cores. For tuning with the requisite precision, tuning cores of this type must be exactly adjusted to a few degrees of angle. When used in channel filters in carrier frequency technology, high demands are made on the adjustment precision of the LC resonant circuits.

The pass-band of such filters lies between 10 and 100 kHz; the band width is about ±2kHz; and the channel spacing is about 300 Hz. To satisfy these requirements, relatively large inductance and capacitance values (1-100 mH and 0.5-5 nF) are needed combined with high resonant circuit quality, such as close tolerances and stable component elements. The main technical problem in the production of filters of this type is the tuning of the resonant frequency, which must have a precision tuning of approximately 1% (pars pro mille). According to the prior art this tuning is carried out by altering the inductance value of the resonant circuit coil. For this purpose, an air gap in the magnetic coil core is altered by introducing a tuning core. An arrangement of this type results in expensive mechanics for achieving the necessary precision and stability. The tuning operation is time consuming and difficult to automate. In addition, with the prior art the temperature coefficient of the resonant circuit is also influenced as a result of the tuning of the inductance. This is not the case when tuning can be done by altering the capacitance. The use of rotary capacitors for this purpose is, however, much too expensive for most cases, particularly if large capacitance values are required.

SUMMARY OF THE INVENTION

It is an object of the present invention to provide a tunable LC resonant circuit, which has a resonant frequency of high precision and stability consistent with high quality.

This objective is accomplished with an LC resonant circuit which contains a fixed tuned coil and a capacitor which is tuned by the removal of layer surface portions. The capacitor is constructed as a layer capacitor which is essentially flat, capable of self-healing and has a relatively small number of layer surfaces and dielectric layers lying one on top of another.

An LC resonant circuit of this type has the advantage that it contains no adjustable tuning elements and nevertheless makes possible tuning with the requisite precision. A capacitor construction which is advantageous for this purpose is known from U.S. Pat. No. 3,857,074. Since the individual layers in such a capacitor lie one on top of the other without any special pressure, the vapors or gases occurring during the destruction of the layer portions to be removed can escape without gas bubbles remaining in the capacitor which would bring about instability resulting from pressure differences.

A simple tunable construction exists when the tuned capacitor has at least a first covering film of polyethylene terephthalate, at least one conductive layer surface situated therebelow from which portions may be removed for tuning, and if the capacitor is arranged spatially in such a way that the first covering film can be penetrated by a laser beam. A covering film of polyethylene terephthalate is permeable for laser light from a YAG giant pulse laser, for example, so that the latter can be employed for removing the layer. In the process, the cover film is not destroyed and the fine quality of the capacitor remains intact. An unground ferrite core of perminvar ferrite or other high quality ferrite material is advantageously used for the coil since a tuning of the coil by means of grinding of a ferrite core is not required. Such grinding would destroy the advantageous characteristics of the materials named.

A polystyrene with a high α-methylstyrene content is especially suitable as the material for the dielectrics of the capacitors. This material is especially temperature stable and its electrical parameters do not change over a wide temperature range. Its temperature coefficient corresponds to that of the polystyrene previously used for the capacitors, so that the previously used coil cores can continue to be used. For the required high tuning precision, it is preferable that, in addition to the tuned capacitor, at least one fixed capacitor is provided which is electrically connected in parallel to the tuned capacitor. In this way the capacitor to be tuned can have a smaller capacitor and thus a smaller surface capacity (capacity per unit of surface). Thus, the relative capacitance change of the total capacitance (total capacitance = fixed capacitance + tunable capacitance) becomes less, and therefore more precise per surface portion removed. The fixed capacitor is preferably installed in moisture proof fashion such that any possible atmospheric humidity effects can only reach one portion of the capacitance, namely the tuned capacitor.

The original capacitance value of the tuned capacitor does not need to be greater than the largest expected tuning range.

Preferably the core of the coil for the LC resonant circuit of this invention is made of a high quality ferrite. Materials of this type are, for example, manganese-zinc ferrites with a tempered-in Perminvar type characteristics. Ferrites with tempered-in Perminvar type characteristics concern ferrite materials whose magnetic properties are fashioned such that they coincide with the corresponding properties of magnetic material known under the trademark "Perminvar". Perminvar was the first alloy whose permeability was linear in a particularly broad control range and whose hysteresis losses were very small. A magnetic material (alloy or ferrite) with comparable properties is generally talked about as having "Perminvar characteristics". At a $\mu_i$ of about 1000, they have extremely good loss characteristics. Ferrites of this type were not previously useable for LC resonant circuits of the instant type since, because of their low permeability values, sufficient tuning was not possible. For a sufficient tuning range, such a wide air gap would have been needed that as a result of such a gap the good loss characteristic of the materials would no longer have come into play. For this reason an initial permeability of at least 2000 was necessary in the previous tuning technology.

Since the coil no longer needs to be tuned, an advantageous embodiment of the invention permits use of a particularly simple coil construction in which the coil is formed with windings in the form of printed conductor paths. These windings are advantageously formed from an electrically conductive layer by means of an etching technique. Thus, in a simple manner, spiral coils can be produced. In many cases a one layer coil suffices, particularly for small inductances.

The LC resonant circuits of this invention can be advantageously used in a channel filter, for example, which is constructed in such a way that the capacitors are arranged spatially in front of the coils, overlapping one another. Each capacitor to be tuned can then be easily reached by means of a laser beam. By means of such construction, a space-saving form of this invention results in which tuning may be effected by the removal of capacitor layers by means of a laser beam. Depending in each case on the wiring of the capacitors to each other, it is recommended that the capacitors to be tuned are arranged next to one another in a row in front of the coils. The surfaces of the capacitors should also be inclined in the direction of this row. Alternatively, some of the capacitors may be connected together as one unit with a connection of the capacitors occurring via a corresponding arrangement of layer surfaces. The former case is especially favorable for capacitors which are not connected with further capacitors; the latter case, however, simplifies the construction of the channel filter since the corresponding capacitors are already connected with one another before installation.

In a process for the production of an LC resonant circuit of the invention, the temperature variation of the resonant frequency is adjusted by a corresponding selection of the core material and by a pretuning of the coil; the resonant circuit is constructed according to tight tolerance requirements using a layer capacitor; and finally the resonant frequency is adjusted by a decrease of the capacitance by aiming a focused laser beam at the layer capacitor with an intensity sufficient for burning out or vaporizing away at least one layer in such a way that it penetrates through the covering film which is permeable to the laser light. Automatic tuning may be achieved by means of a movement of the laser beam with respect to the layer, this movement being controlled by a computer.

In the described process the incident angle of the laser light on the covering film is selected in such a way that only a small portion of the laser light is reflected and the laser light penetrates almost completely to the layer to be removed.

For tuning a channel filter or other circuit constructed of several LC resonant circuits, it is preferable to not only carry out a functional tuning of the resonant circuits in the described manner, but rather also to incorporate into the tuning operation the capacitors which serve to couple the individual resonant circuits in the filter or in the total circuit; in this way a greater variation possibility of the tuning operation is possible.

In order to achieve an electrostatic shielding of the filter arrangement it is preferable that the capacitors be arranged such that in each case the layer facing toward the laser is grounded.

It is advantageous to subdivide each capacitance into two or more capacitors connected in parallel, one of which serves for the rough tuning and one for the fine tuning. The arrangement of all capacitors on one side of the coils makes possible tuning by means of only one laser beam from one side. On the other hand, the arrangement of the capacitors on both sides of the coils provides a better shielding and saves more space.

A preferred division of the capacitance occurs by forming 70% of the capacitance with a capacitor with a fixed capacitance, whereas the remaining capacitance of 30% is formed by a capacitor of the type described which is tunable by means of a laser. Capacitors of this type are available, for example, with a surface capacity of 0.2 to 2 nF/cm$^2$. With a single laser pulse of a YAG laser of conventional construction surfaces of about 250$\mu$m thickness can be removed. With a total capacity of 1 nF, a removal of only 1% of the capacitance per laser pulse is possible. The requisite precision can thus be realized quite easily.

DESCRIPTION OF THE PREFERRED EMBODIMENTS

Figure 1:
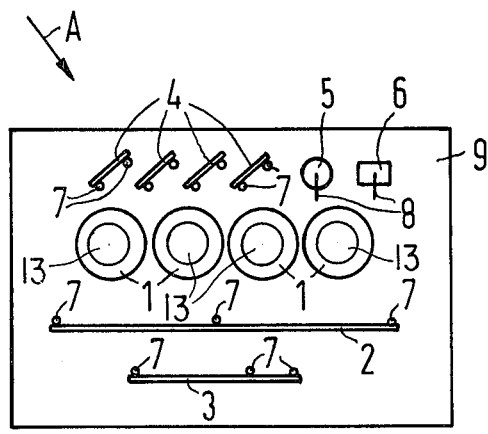
FIG. 1 illustrates a plan view of an LC resonant circuit of this invention showing the arrangement of coils and capacitors with respect to one another.

In the channel filter of this invention, tunable capacitors 2, 3 and 4 and non-tunable capacitors 5 and 6 are arranged on both sides of fixed-tuned coils 1. The capacitors 4 are arranged next to one another in a row in front of the coils and their surfaces are inclined in the direction of this row. A laser beam is focused in direction A at these capacitors for the removal of at least a portion of a conductive layer of each of these capacitors for the purpose of tuning.

Capacitors 2 and 3 are respectively connected as one piece to one another and wired together by a corresponding configuration of the layers. A laser beam in direction B is focused on these capacitors for tuning sufficient portions of these capacitors.

Moisture-protected fixed capacitors 5 and 6 are also accommodated on the circuit in a space-saving arrangement and are connected in parallel to corresponding capacitors 2, 3 or 4.

The capacitors are connected to a printed circuit on the under side of the mounting plate 9 via connection wires 7 or, respectively 8 and are thus wired to the other component elements and mechanically held by means of the mounting plate.

Figure 2:
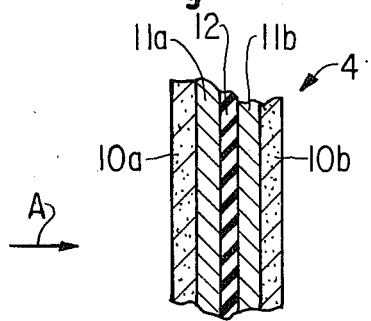
FIG. 2 illustrates in cross-section one embodiment of a laser tunable capacitor employed in this invention.

As shown in FIG. 2 the laser trimmable self-healing capacitor 4 in one preferred embodiment has a basic structure formed of a central dielectric 12 with metal layers 11a, 11b on either side of dielectric film 12. A terepthalate covering film 10a, 10b covers the metal layers 11a, 11b. This covering film is permeable to the rays of laser beam A to permit a burning away of portions of the metal layer such as 11a for purposes of trimming the capacitor 4.

As shown in FIG. 1 unground ferrite cores 13 are provided in the coils 1.

Although various minor modifications may be suggested by those versed in the art, it should be understood that we wish to employ within the scope of the patent warranted hereon all such modifications as reasonably and properly come within this scope of our contribution to the art.

We claim as our invention:

1. An arrangement of coils and capacitors for narrow tolerance resonant circuits in channel filters in the carrier frequency technology within the frequency range of between approximately 10 and 100 kHz, comprising:
   (a) a mounting plate carrying and connecting the coils and capacitors;

(b) at least one fixed-tuned coil whose inductance is set in a fixed non-adjustable manner, said coil having a magnetic core and at least one wire winding;

(c) at least one self-healing laser trimmable capacitor comprising a flat stack of at least two metal layers which are separated by a dielectric layer and which are covered by a laser light permeable non-destructing cover film, at least two connecting wires contacting with the metal layers, the self-healing capacitor being oriented towards an edge of the base plate with respect to the fixed-tuned coil so that at least a first of the metal layers can be burned off through the cover film by means of an incident laser beam, said fixed-tuned coil being positioned inwardly of the self-healing capacitor from the edge of the mounting plate, said laser-trimmable capacitor cover film being substantially undamaged when the capacitor is trimmed by a laser beam; and (d) a narrow-tolerance channel-filter resonant circuit being formed which includes said fixed-tuned coil and self-healing capacitor and has a resonant frequency within the frequency range of approximately 10 to 100 kHz, any additional coils forming the resonant circuit being fixed tuned and non-adjustable.

2. An arrangement in accordance with claim 1, characterized in that the mounting plate is a printed circuit plate.

3. An arrangement in accordance with claim 2, characterized in that the magnetic core comprises a ferrite material whose permeability is approximately independent over a broad control range, whose magnetic losses are low, and which has a starting permeability $\mu_i$ of about 1000.

4. An arrangement in accordance with claim 3, characterized in that the magnetic core consists of a tempered manganese-zinc ferrite.

5. An arrangement in accordance with claim 3, characterized in that the magnetic core has tempered in characteristics.

6. An arrangement in accordance with claim 1, characterized in that the laser trimmable capacitor has a dielectric comprising a polystyrene having a high α-methylstyrene content.

7. An arrangement in accordance with claim 1, characterized in that a fixed value capacitor is connected in parallel to the laser-trimmable capacitor.

8. An arrangement in accordance with claim 7, characterized in that the fixed value capacitor is moisture resistant.

9. An arrangement in accordance with claim 1, characterized in that several coils and laser-trimmable capacitors are provided, each capacitor being arranged in front of a respective coil, the laser-trimmable capacitors overlapping one another in such a manner that each capacitor can be exposed to a laser beam.

10. An arrangement in accordance with claim 1, characterized in that several laser-trimmable capacitors are provided, that they are arranged one next to the other in a row in front of a plurality of coils, surfaces of the laser-trimmable capacitors being inclined towards the direction of the row.

11. An arrangement in accordance with claim 1, characterized in that at least several laser-trimmable capacitors are provided as a single component having several connecting wires.

12. An LC resonant circuit of narrow tolerance for use as a channel filter, comprising:

(a) a mounting plate;

(b) a fixed-tuned coil on the plate whose inductance is set in a fixed non-adjustable manner, said coil having a ferrite core which has not been processed by grinding for tuning the coil;

(c) a self-healing laser trimmable capacitor comprising a flat stack of at least two metal layers which are separated by a dielectric layer and which are covered by a laser light permeable non-destructing cover film, connecting wires on the capacitor connecting to the fixed-tuned coil, said self-healing capacitor being positioned on the mounting plate to permit direct exposure of one of said metal layers to a laser beam to permit burn-off of portions of the metal layer through the cover film without substantial damage to the cover film; and (d) a narrow-tolerance channel filter resonant circuit which includes said coil and capacitor and which has a resonant frequency within the frequency range of approximately 10 to 100 kHz, any additional coils forming the resonant circuit being fixed tuned and non-adjustable.

* * * * *